WAVE SOLDERING APPARATUS AND METHOD

The present invention relates to wave soldering apparatus and method.

A standing wave of molten solder may include molten solder and an oil compound in a desired ratio. The standing wave is formed by a pump in a solder receiving sump which pump forces the molten solder through an upstanding nozzle or fountain. The oil compound is injected into the molten solder and as it has a lower specific gravity than the solder, it usually floats on the solder.

The oil compound is used because it provides certain desirable characteristics to the solder. In wave soldering printed circuit boards, the extended ends of the component leads and adjacent printed circuit conductors are passed through the standing wave of solder. Even with oil mixed with the solder, some of the solder tends to cling to the leads and conductors, forming icicles and in some cases, bridges across the conductors or leads creating short circuits. This excess solder needs to be removed. Further, the apertures through which leads pass should fill with solder and this does not always occur in prior art systems.

The oil intermixed with the solder is known to reduce the surface tension on the solder and helps alleviate the problem of solder icicles, bridging, and so forth. However, the oil sometimes does not become sufficiently mixed with the standing wave of solder and this incomplete distribution of oil is thought to lead to the defects. Some of these defects result from the design of the specific printed circuit board being fabricated, i.e., the closeness, number, spacing of the conductors, leads, and so forth. The defects, whatever their cause, are highly undesirable since they must be repaired by hand which is expensive, requires highly-skilled labor, and when heat is employed, can damage those components which are heat-sensitive. As mentioned above, even when employing a solder-oil mixture as known in the art, numerous bridging defects can occur. By providing a more favorable preheat temperature of approximately 230° F., these defects can be reduced, but, in many applications, not to the degree desired.

In accordance with the present invention, a continuous process for soldering component leads to a conductor on a printed circuit board surface includes applying a hot molten solder to the surface to cause the solder to adhere to the leads and conductors and then applying hot oil to the same surface while the solder at the surface is still molten.

Figure 1:
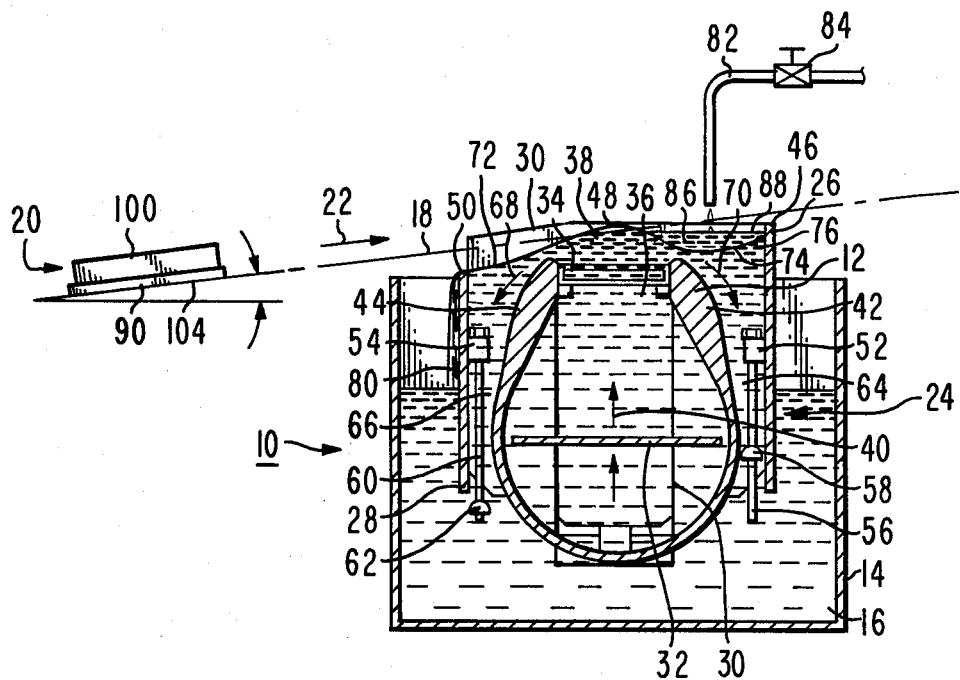
FIG. 1 is a sectional elevation view of a wave soldering apparatus embodying the present invention.
Figure 2:
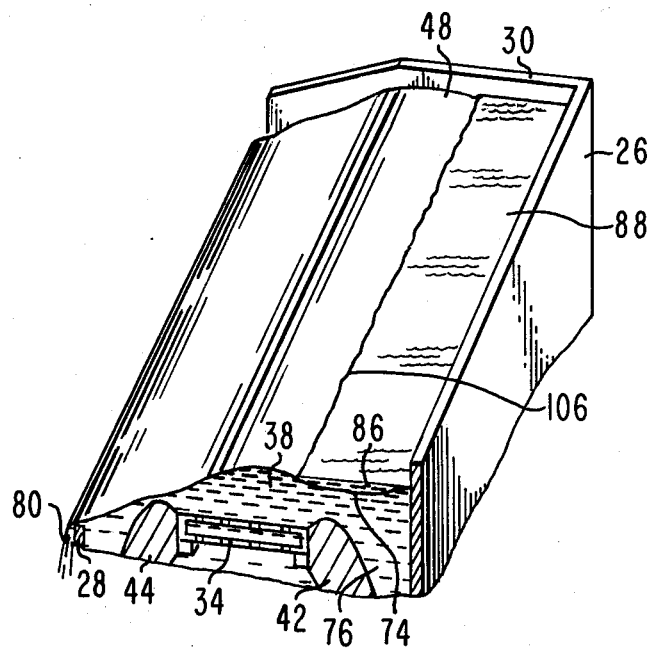
FIG. 2 is an isometric view of the upper surface of the solder wave produced by the apparatus of FIG. 1.
Figure 3:
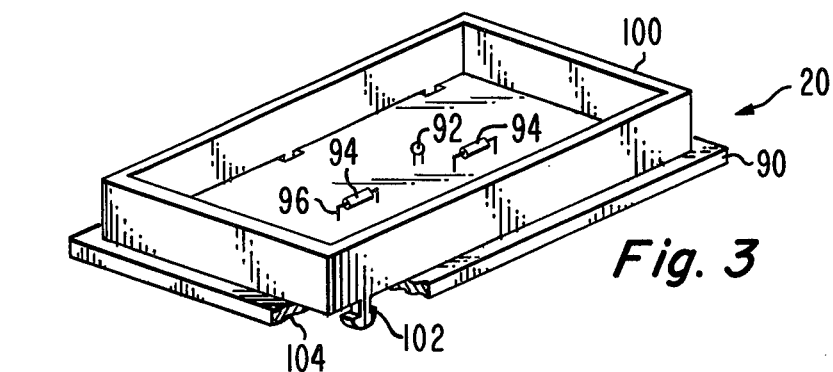
FIG. 3 is an isometric view of a printed circuit board assembly to be conveyed through the wave produced by the apparatus of FIG. 1.
Figure 4:
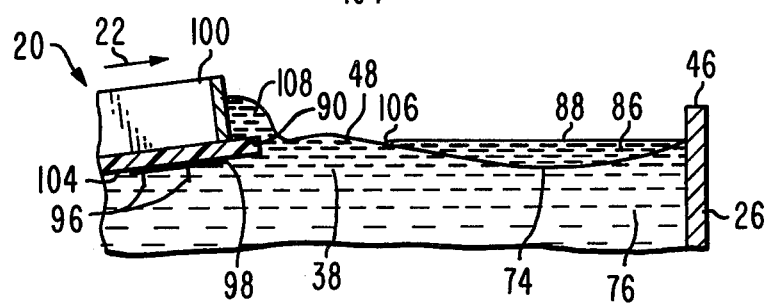
FIG. 4 is a sectional elevation view through a portion of the wave produced by the apparatus of FIG. 1 with the printed circuit board passing through the wave.
Figure 5:
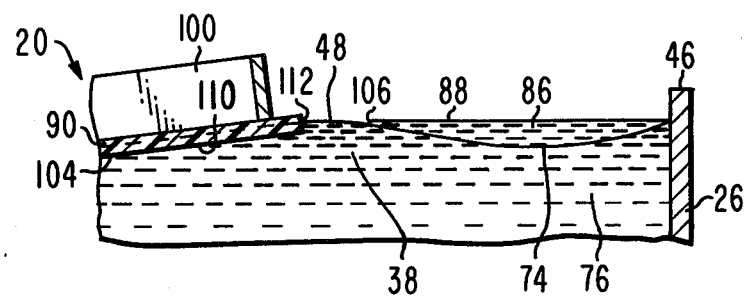
FIGS. 5 and 6 are additional sectional elevation views similar to that of FIG. 4 showing various subsequent steps of the soldering process.
Figure 6:
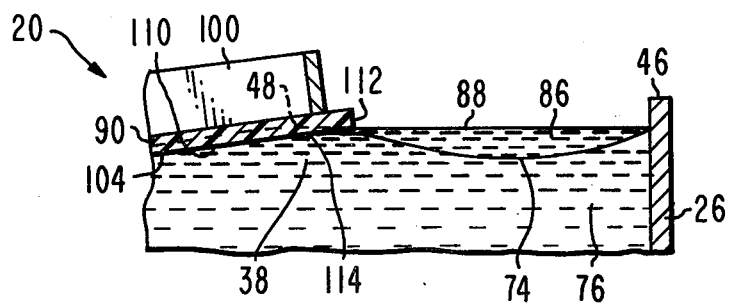

In FIG. 1, wave soldering apparatus 10 comprises a fountain 12 disposed in a solder pot 14 containing a molten solder and oil bath 16. The apparatus 10 includes a conveyor mechanism 18, shown as a broken line, which conveys a printed circuit board assembly 20 in the direction 22. The conveyor direction 22 is at an angle α such as 7° with the horizontal. The apparatus 10 may be a commercially available wave soldering apparatus modified as described later herein. For example, the wave soldering apparatus 10 may include a structure commercially available and sold by Hollis Engineering, Inc., as Models TDC, TDS, or TDB; the structures of which and their descriptions, are incorporated by reference herein. Other known wave soldering apparatus may also be employed, such as, for example, one described in U.S. Pat. No. 3,737,615. Only so much of the commercial machine is described herein as is needed for an understanding of the present invention. Components such as the sump pump, plumbing and various other elements are neither shown nor described.

Sump 24 is situated within the molten solder bath 16 in pot 14. Sump 24 has two side plates 26 and 28, and two end plates 30 (only one of which is shown). Vertical baffle 31 and a horizontal baffle 32 are employed in a known way. An upper baffle and screen assembly 34 are also employed in a known way.

The fountain 12 comprises a horizontal channel member having a mouth at 36 facing vertically upward. A pump (not shown) pumps solder from the solder bath 16 in the pot 14 through the perforated horizontal baffle 32 and the perforated upper baffle 34 to form a standing wave 38 of hot molten solder having a temperature which may be about 500° F.

The solder forming the wave is forced generally in the vertical upward direction 40. When the solder exits the mouth 36 of the fountain 12, it tends to cascade over both of the fountain 12 side walls 42 and 44.

The sump side wall 26 downstream of the standing wave 38 has an upper edge 46 which is higher in elevation than the uppermost level of crest 48 of the standing wave 38. The upstream sump wall 28 upper edge 50 is below the uppermost surface of the crest 48. End plates 30 extend above the uppermost surface of the crest 48. Secured to the inner surface of plate 26 is a metal block 52 and a similar block 54 is secured to the inner surface of wall 28. Two bolts 56 (only one being shown) are captivated by the block 52 and are threaded through a choke bar 58. Similarly, two bolts 60 (only one being shown) are captivated by the block 54 and threaded through a choke bar 62. Choke bars 58 and 62 may be identical and comprise horizontal elongated bars having an arcuate upper surface.

When the bolts 56 and 60 are rotated, they cause the choke bars 58 and 62 to move in the vertical directions parallel to direction 40. These choke bars tend to open and close the respective passageways 64 and 66 between respective walls 42 and 26 on the downstream side of the fountain and walls 44 and 28 on the upstream side of the fountain.

The solder from the wave 38 tends to cascade over upstream wall 44 in direction 68 and over downstream wall 42 in the direction 70. The solder flowing in direction 68 tends to flow between the fountain 12, wall 44 and the sump wall 28 into the lower portion of the pot 14. Similarly, the solder from the wave 38 flowing in direction 70 tends to flow between the sump wall 26 and fountain wall 42 into the lower portion of the pot 14. The choke bars 58 and 62 open and close these flow paths and, in essence, "choke" the flow of solder in the directions 68 and 70.

the molten solder bath of wave 38, the surface 104 passes directly into the hot oil pool 86. Therefore, prior to any cooling of the solder, the molten solder coated component leads and conductors on the lower surface 104 are immediately immersed in the hot oil of pool 86, the oil in the pool being heated by the molten solder. It is believed that reduced bridging, that is, interconnections between conductors on the printed circuit board surface 104 and icicles and other undesirable excess solder adhesions may be due to a combination of reduced solder surface tension created by the hot oil in pool 86 and a reduced solder cooling rate which results from longer contact of the printed circuit board with a hot fluid due to the presence of the oil pool 86. In any case, it has been determined by tests that the number of normal "bridges" has been reduced by a factor of about 10, using the present apparatus, all other parameters of the process remaining constant. There also has been observed a decrease in the number of voids in apertures through which component leads pass. Thus, a significant improvement in the quality of a printed circuit board has been provided by the inclusion of the hot oil pool 86 in combination with a molten solder standing wave 38.

While a pool 86 of hot oil has been shown in connection with one known type of wave soldering apparatus, it will be equally apparent that such a pool can be provided in other types of wave soldering apparatus. The important criterion is that the pool of oil abut the crest of the standing solder wave so that the surface of the article to be soldered passes immediately from the solder wave through the hot standing oil pool without exposure to ambient air. Ambient air cools the solder relatively quickly and forms the solder "bridges," icicles, and other undesirable excess solder conditions. The hot oil in which the molten solder is immersed immediately following the application of the hot molten solder to the parts being soldered reduces the solder tension an amount sufficient so that the excess solder falls free and breaks away from the surface being soldered and does not readily adhere to that surface.

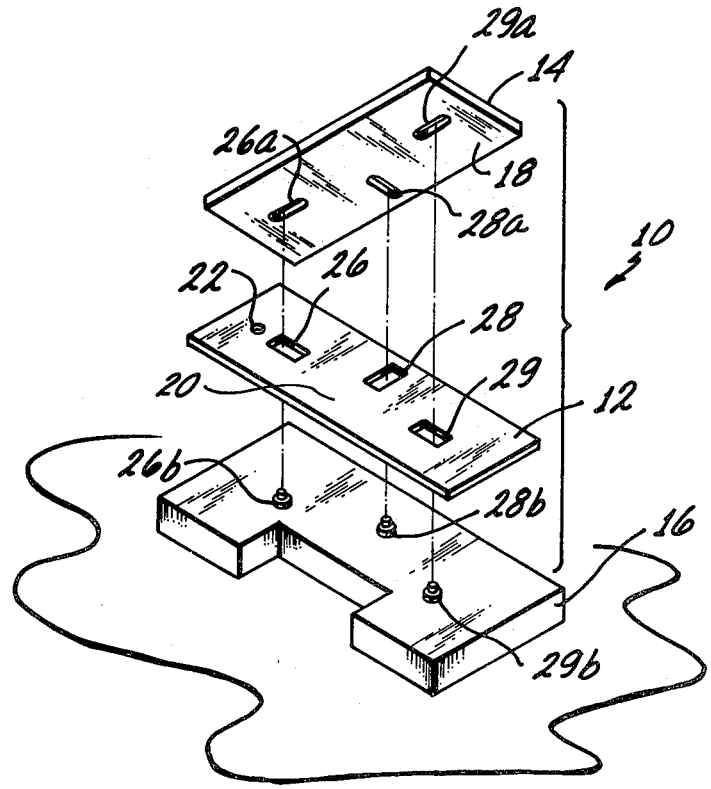

What is claimed is:

1. A continuous process for soldering component leads to a conductor on a printed circuit board surface comprising:
   applying hot molten solder to said surface to cause the solder to adhere to the leads and conductor; and
   applying hot oil to the solder adhering to said leads and said conductor by passing said surface directly into a hot oil pool immediately after applying said hot molten solder without exposing said applied solder to any cooling medium.

2. The process of claim 1 wherein said step of applying solder includes passing said surface through a standing wave of said molten solder and said step of applying hot oil includes passing said surface while still in said wave into said hot oil pool.

3. The process of claim 1 wherein said step of applying hot oil includes moving said surface in contact with said oil while said surface is in contact with said solder and causing said oil to flow against said applied solder at said surface.

4. A wave soldering process comprising:
   forming a standing wave in a pool of molten solder;
   forming a standing pool of hot oil in a depressed region at the surface of said pool of solder, adjacent to said standing wave; and
   passing an article to be soldered first through said wave and then immediately thereafter into contact with said pool of hot oil.

5. The process of claim 4 wherein said passing step comprises depressing the crest of said wave with said article and causing oil from said pool of hot oil to flow against said depressed crest so as to cover said depressed crest with oil while said article is in said standing wave.

6. A method of soldering component leads to a printed circuit board having at least one conductor thereon comprising:
   applying molten solder to a surface of the board in which said conductor and the lead of said components are present, said solder tending to adhere to said leads and conductor; and
   immediately following said solder applying step and while the solder adhering to said leads and conductor is still molten and without exposing said applied solder to any cooling medium applying a pool of hot oil to said solder applied surface to thereby remove excess solder which otherwise might adhere to said leads and said conductor.

7. A wave soldering apparatus comprising:
   means for conveying a printed circuit board along a path;
   means for forming a standing wave of molten solder which intersects said path; and
   means for forming a pool of oil on the surface of said molten solder adjacent to said standing wave, downstream from the crest of said wave, with reference to the direction along said path in which the circuit board is conveyed, at least a portion of said pool of oil being positioned with respect to said crest so that as the board passes out of the standing wave of solder, the solder adhering to the board passes into the pool of oil, while the adhering solder is still molten.

8. The apparatus of claim 7 wherein said means for forming a pool includes means forming a liquid retaining depression adjacent to said wave and means for depositing said oil into said depression to form said pool.

9. The apparatus of claim 8 wherein said means for forming a pool includes nozzle means for urging liquid molten solder into an upward directed stream, said stream tending to cascade over first and second opposite sides of said nozzle means to form said wave, and flow restricting means on one of said sides for restricting the flow of said cascading solder on the one side so as to form said liquid retaining depression.

10. The apparatus of claim 8 wherein said pool of oil tends to become depleted, and wherein said means for depositing includes oil dispensing means for dispensing oil into said depression at a rate such that the level of said oil in said pool remains substantially constant.

11. An apparatus for continuously soldering component leads to a conductor on a printed circuit board surface comprising:
   means for conveying said board;
   means for applying hot molten solder to said surface during said conveying to cause the solder to adhere to the leads and conductor; and
   means for applying a pool of hot oil to the solder adhering to said leads and said conductor immediately after applying said hot molten solder without exposing said applied solder to any cooling medium.

12. A wave soldering apparatus comprising:

means for forming a bath of molten solder;

nozzle means located in said bath for forming a standing wave of said molten solder, said nozzle means including a first wall over which said solder from said wave cascades;

means for forming a pool of molten solder from the solder flowing from said wave on a side of said wave opposite said first wall;

means for setting the level of the upper surface of the pool of solder below the level of the upper surface of the crest of said wave, and for maintaining the surface of the solder pool substantially stationary;

means for depositing oil onto said solder pool, said oil having a specific gravity value lower than that of the solder so the oil floats on said solder pool surface;

means for retaining said oil in said solder pool in an oil pool; the upper oil pool surface having a level close to the level of the crest of the solder standing wave; and means for passing an article to be soldered through said standing wave crest and then the oil pool the surfaces of said oil pool and said solder abutting where in contact with said article surface.

13. The apparatus of claim 12 wherein said means for forming a bath includes a housing in which is located said nozzle means, and means for urging said solder from said housing into said nozzle means to form said wave, said wave tending to cascade over the upper end of said nozzle means and into said bath, said means for setting including a second wall spaced from the nozzle means and having an upper edge at a level sufficiently high to prevent solder from cascading thereover, and valve means between said nozzle means and said second wall and said bath for restricting the flow of solder from said wave to said bath forming said solder pool.

* * * * *

United States Patent [19]

Cusack et al.

[11] Patent Number: 4,463,892
[45] Date of Patent: Aug. 7, 1984

[54] METHOD FOR MANUFACTURING IC PACKAGES

[75] Inventors: Michael D. Cusack, Ramona; Kenneth B. Turnbaugh, Redondo Beach, both of Calif.

[73] Assignee: Burroughs Corporation, Detroit, Mich.

[21] Appl. No.: 356,845

[22] Filed: Mar. 10, 1982

Related U.S. Application Data

[63] Continuation of Ser. No. 125,450, Feb. 28, 1980, abandoned.

[51] Int. Cl.³ .............................................. B23K 31/02
[52] U.S. Cl. ..................................................... 228/212
[58] Field of Search ................ 228/122, 123, 212, 4.1, 228/6 R, 49 R; 29/238

[56] References Cited

U.S. PATENT DOCUMENTS 1,885,960  11/1932  Doyle ............................. 29/238 X
3,786,556  1/1974  Weston ............................... 228/123

FOREIGN PATENT DOCUMENTS 2014177  10/1971  Fed. Rep. of Germany ...... 228/212

Primary Examiner—Kuang Y. Lin
Assistant Examiner—P. Weston Musselman, Jr.
Attorney, Agent, or Firm—Charles J. Fassbender; Kevin R. Peterson; Joseph R. Dwyer

[57] ABSTRACT

Disclosed is a method and an article formed thereby which includes a part which is subjected to heat during fabrication of an IC package, and a fixture for holding such a part, having an arrangement for accommodating the expansion and contraction of the part during heating and cooling while holding the part in alignment. In one embodiment, the expansion and contraction arrangement comprises slots arranged as apices of a triangle in the part which receives pins in the fixture with the major axes of the slots in alignment with the point of minimum expansion and contraction of the part. Utilizing the triangulation principle, the location of the datum hole (or locating criteria), if not at the point of minimum expansion and contraction of the part, can be effectively translated to the center of minimum expansion and contraction.

10 Claims, 11 Drawing Figures